(12) United States Patent
Chu et al.

(10) Patent No.: US 7,394,698 B1
(45) Date of Patent: Jul. 1, 2008

(54) METHOD AND APPARATUS FOR ADJUSTING A READ REFERENCE LEVEL UNDER DYNAMIC POWER CONDITIONS

(75) Inventors: Chi-Ling Chu, Dali (TW); Jian-Yuan Shen, Taichung (TW); Chou-Ying Yang, Changhua County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/617,030

(22) Filed: Dec. 28, 2006

(51) Int. Cl.
*G11C 16/00* (2006.01)

(52) U.S. Cl. .................... 365/185.2; 365/210

(58) Field of Classification Search .............. None
See application file for complete search history.

(56) References Cited

U.S. PATENT DOCUMENTS

| | | | | |
|---|---|---|---|---|
| 5,153,853 A | * | 10/1992 | Eby et al. | 365/185.08 |
| 5,784,314 A | * | 7/1998 | Sali et al. | 365/185.2 |
| 6,421,275 B1 | * | 7/2002 | Chen et al. | 365/185.2 |
| 6,845,029 B2 | | 1/2005 | Santin et al. | |
| 7,239,553 B2 | * | 7/2007 | Suitou et al. | 365/185.22 |

* cited by examiner

*Primary Examiner*—Tan T. Nguyen
(74) *Attorney, Agent, or Firm*—Kenta Suzue; Haynes Beffel & Wolfeld LLP

(57) ABSTRACT

A read reference determining the logical value for results read from memory is adjusted during unstable power conditions.

26 Claims, 7 Drawing Sheets

METHOD AND APPARATUS FOR ADJUSTING A READ REFERENCE LEVEL UNDER DYNAMIC POWER CONDITIONS

BACKGROUND OF THE INVENTION

Field of the Invention

The technology is related to accurately reading data from a memory such as nonvolatile memory under conditions where the power voltage is not static, such as during a power on sequence.

SUMMARY OF THE INVENTION

One aspect of the technology is a method of operating an integrated circuit under dynamic power conditions, including the following step(s):

during a change of a power voltage, in response to at least one comparison of data having a first logical value and data having a second logical value, whereby the data are read from a nonvolatile memory with a read reference level, adjusting the read reference level determining the first logical value and the second logical value from each other, whereby the first logical value and the second logical value are represented by different ranges of a physical characteristic stored by the nonvolatile memory.

Some embodiments further comprise, during the change of the power voltage to the steady value, and after said adjusting the read reference level, reading various data from the nonvolatile memory with the updated read reference level. Examples of such various data are: bandgap data controlling the integrated circuit, reading programming data controlling the integrated circuit, erasing data controlling the integrated circuit, program pulse width data controlling the integrated circuit, program pulse voltage data controlling the integrated circuit, erase pulse width data controlling the integrated circuit, and erase pulse voltage data controlling the integrated circuit.

In some embodiments, in response to the comparison of data showing an excess amount of data having the first logical value relative to data having the second logical value, the read reference level is adjusted such that a comparison of data from additional reads from the nonvolatile memory during the change of the power voltage will have more balanced amount of data having the first logical value relative to data having the second logical value.

In some embodiments, adjusting the read reference level occurs after a power on reset circuit is finished.

In some embodiments, adjusting the read reference level is complete after the power voltage is sufficiently large for regular operation of the integrated circuit.

In some embodiments, adjusting the read reference level occurs after a power fluctuation lowers the power voltage to be insufficiently large for regular operation of the integrated circuit.

In some embodiments, adjusting the read reference level is complete after the power voltage is stable.

Another aspect of the technology is an integrated circuit operating under dynamic power conditions, comprising a nonvolatile memory array and control logic. The nonvolatile memory array stores data having a first logical value and data having a second logical value. The first logical value and the second logical value are represented by different ranges of a physical characteristic stored by the nonvolatile memory.

The control logic is coupled to the array. The control logic adjusts a read reference level for data read from the nonvolatile memory array by determining the first logical value and the second logical value from each other, as described herein.

Yet another aspect of the technology is an integrated circuit operating under dynamic power conditions, with a means for adjusting the read reference level as described herein.

DETAILED DESCRIPTION

Figure 1:
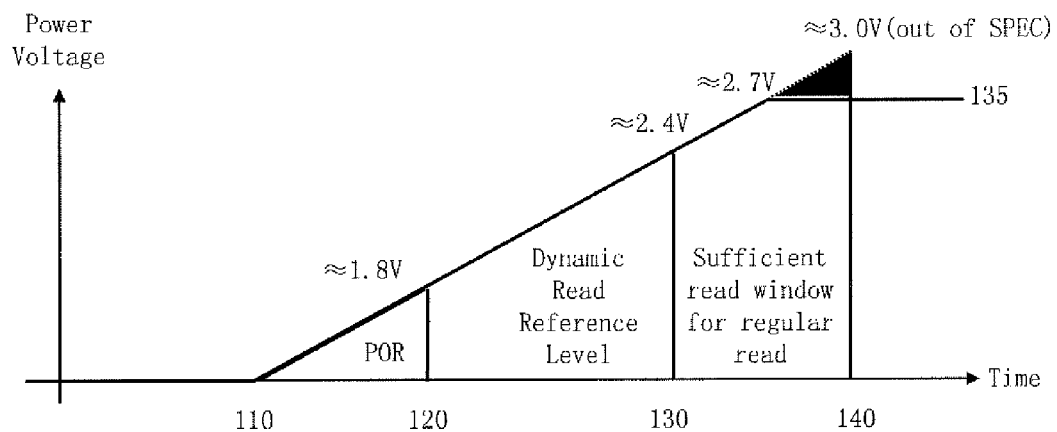
FIG. 1 is a chart of power voltage versus time, showing a window of operation for an embodiment.

FIG. 1 is a chart of power voltage versus time, showing a window of operation for an embodiment. At time 110, a power on reset circuit (POR) operates. At time 120, the power on reset circuit has completed operation so that the power voltage is anywhere from about 1.8 V to about 2.2 V, but the power voltage still has a low magnitude, such that a regular read window is not open. Because the read window is still too narrow and the magnitude of the power voltage is still rising, a static read reference level suited for regular operating conditions is inappropriate. Accordingly, the read reference level is dynamic, as disclosed herein, and the read reference level adjusts up or down as necessary to obtain consistent results from reading a nonvolatile memory. At time 130, the magnitude of the power voltage has risen about 2.4 V, and the read window is sufficiently wide to allow for a regular static read reference. When the magnitude of the power voltage has risen to about 2.7 V, it has reached a static power voltage 135. At time 140, an alternate condition of a power voltage of 3.0 V is shown, which is too high for regular operation.

Figure 2:
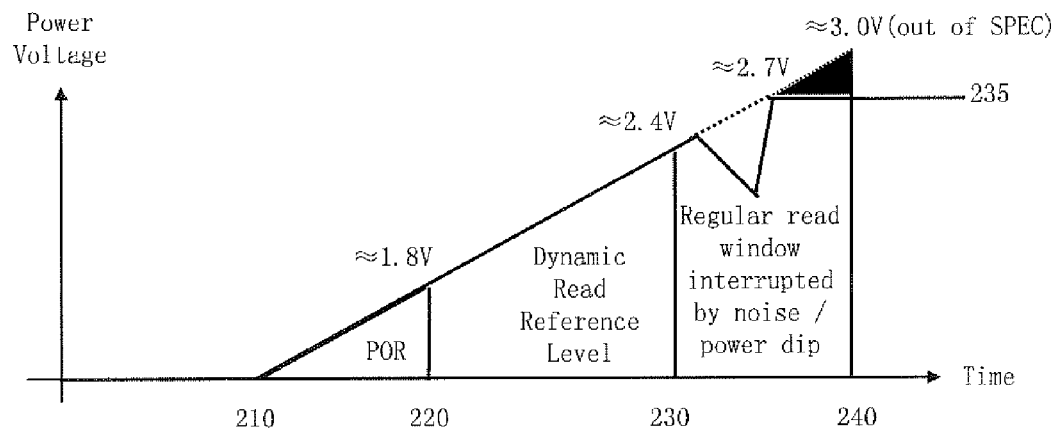
FIG. 2 is a chart of power voltage versus time, showing a window of operation for an embodiment which includes noise or power dips.

FIG. 2 is a chart of power voltage versus time, showing a window of operation for an embodiment which includes noise or power dips. In addition to the dynamic read reference level shown in FIG. 1, the dynamic read reference level operates during noise or power dips which disrupt what would otherwise be a sufficient read window.

Figure 3:
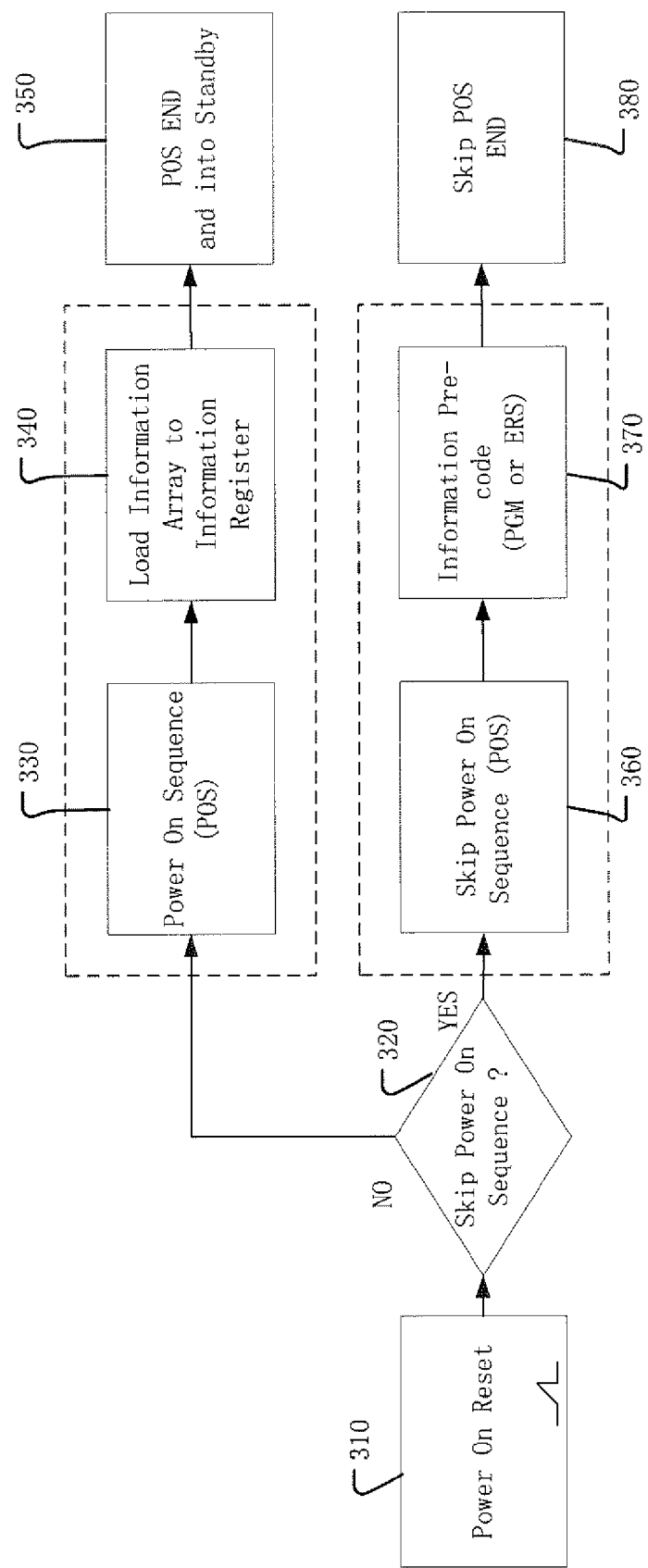
FIG. 3 is an exemplary flowchart of the power on sequence following the power on reset process.

FIG. 3 is an exemplary flowchart of the power on sequence following the power on reset process. The dynamic read reference level may be skipped or used. Skipping the dynamic read reference level saves time, and is applicable for wafers with a sufficient default read reference, due to satisfactory local cell to register. After the power on reset procedure 310, it is determined whether to skip the power on sequence 320. If no, then the power on sequence 330 occurs. Then, in 340 the contents of the information array is loaded to the information registers. The information array stores data for controlling the integrated circuit, such as operation conditions for read, program, and erase operations, that were decided upon a wafer sort test. Other information array data include bandgap bits, and readlevel bits. Then, the power on sequence ends 350. However, if the power on sequence is skipped, then after skipping the power on sequence 360, information from the wafer sort test is pre-coded into the information array, either program or erase. Then, the skipped power on sequence branch ends 380.

Figure 4:
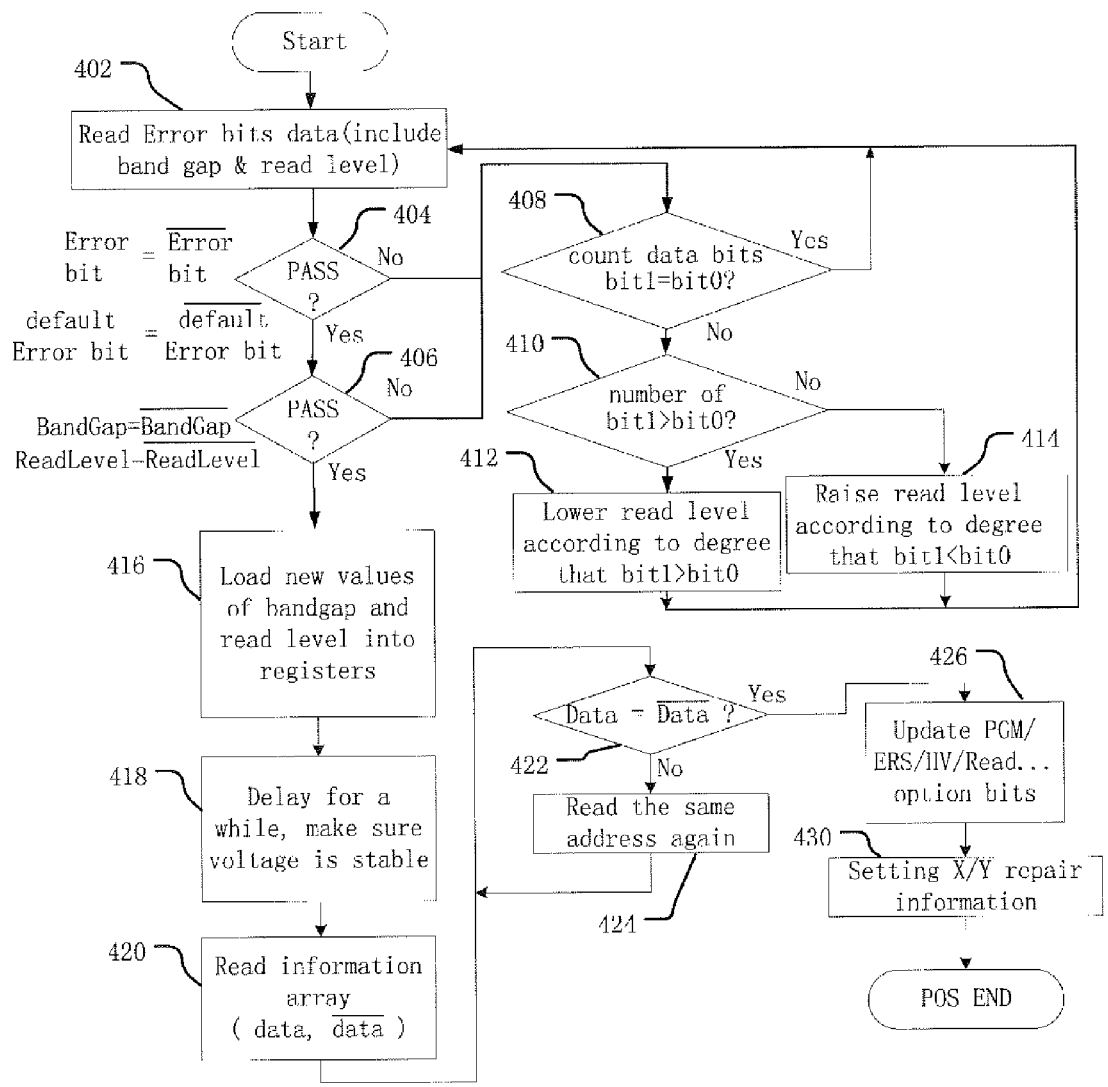
FIG. 4 is an exemplary flowchart of a dynamic read reference which adjusts according to the relative amount of "0" bits and "1" read from a nonvolatile memory with the dynamic read reference.

FIG. 4 is an exemplary flowchart of a dynamic read reference which adjusts according to the relative amount of "0" bits and "1" read from a nonvolatile memory with the dynamic read reference. After starting, at 402 Read Error bits data are read, including the bandgap bits and the error bits. A known distribution of "1" bit and "0" bits is then compared. For example, a stored code is compared, along with its complement. For example, if the "Error bit" has code FF, then $\overline{\text{Errorbit}}$ must be 00. In another example, if Error bit has a code AA, then $\overline{\text{Errorbit}}$ must be 55. So the equations are signify that one side of the equality must correspond correctly to its complement on the other side of the equation. Additionally, there is a comparison of "default error bit" and $\overline{\text{defaultErrorbit}}$. The "Error bit" is also compared with the "default Error bit". The "Error bit" is formed at skip power-on pre-code, and the "default Error bit" is implemented by circuit. The default error bit is unchangeable.

In one example circuit, a first set of multiple XOR circuits each have as input a "default Error bit" and a read out "Error bit". The output of each XOR circuit is coupled to the gate of a transistor which has one output terminal grounded and the other output terminal coupled to a common node shared by the XOR circuits. In the same example circuit, a second set of multiple XOR circuits each have as input a $\overline{\text{defaultErrorbit}}$ and a read out $\overline{\text{Errorbit}}$, with similar accompanying transistor circuits. The common node is connected to the supply voltage VDD via a p-type transistor with a grounded gate. The common node is the input of a buffer circuit, which outputs whether the Default Error Code passes or fails.

If the comparisons 404 pass, then the procedure moves on to additional comparisons 406 between BandGap and $\overline{\text{BandGap}}$, and ReadLevel and $\overline{\text{ReadLevel}}$. If the comparisons 404 fail or the comparisons 406 fail, then the read reference level is adjusted. The preceding data bits that were read are counted and compared 408. If the number of "0" bits and the number of "1" bits are equal, then the data bits are re-read and the comparisons are repeated. However, if the number of "0" bits and the number of "1" bits are unequal, then if the number of "1" bits exceeds the number of "0" bits 410, the read reference level is lowered to the degree that the number of "1" bits exceeded the number of "0" bits 412. Similar, if the number of "1" bits is less than the number of "0" bits, the read reference level is raised to the degree that the number of "0" bits exceeded the number of "1" bits 414. The procedure loops back to 402.

After the comparisons 404 and 406 pass, then the new values of the bandgap and read level are loaded into the register 416. A delay occurs to make sure that the voltage is stable 418. The information array 420 is read. The read data is compared with its complement 422 in a manner similar to comparisons 404 and 406. If the comparison fails, the same addresses are read again form the information array 424 and the comparison 422 is repeated. If the comparison passes, then the option bits such as program, erase, high voltage, and read option bits are updated 426. Then, X/Y repair information is set 430, as shown from the wafer sort test.

Figure 5:
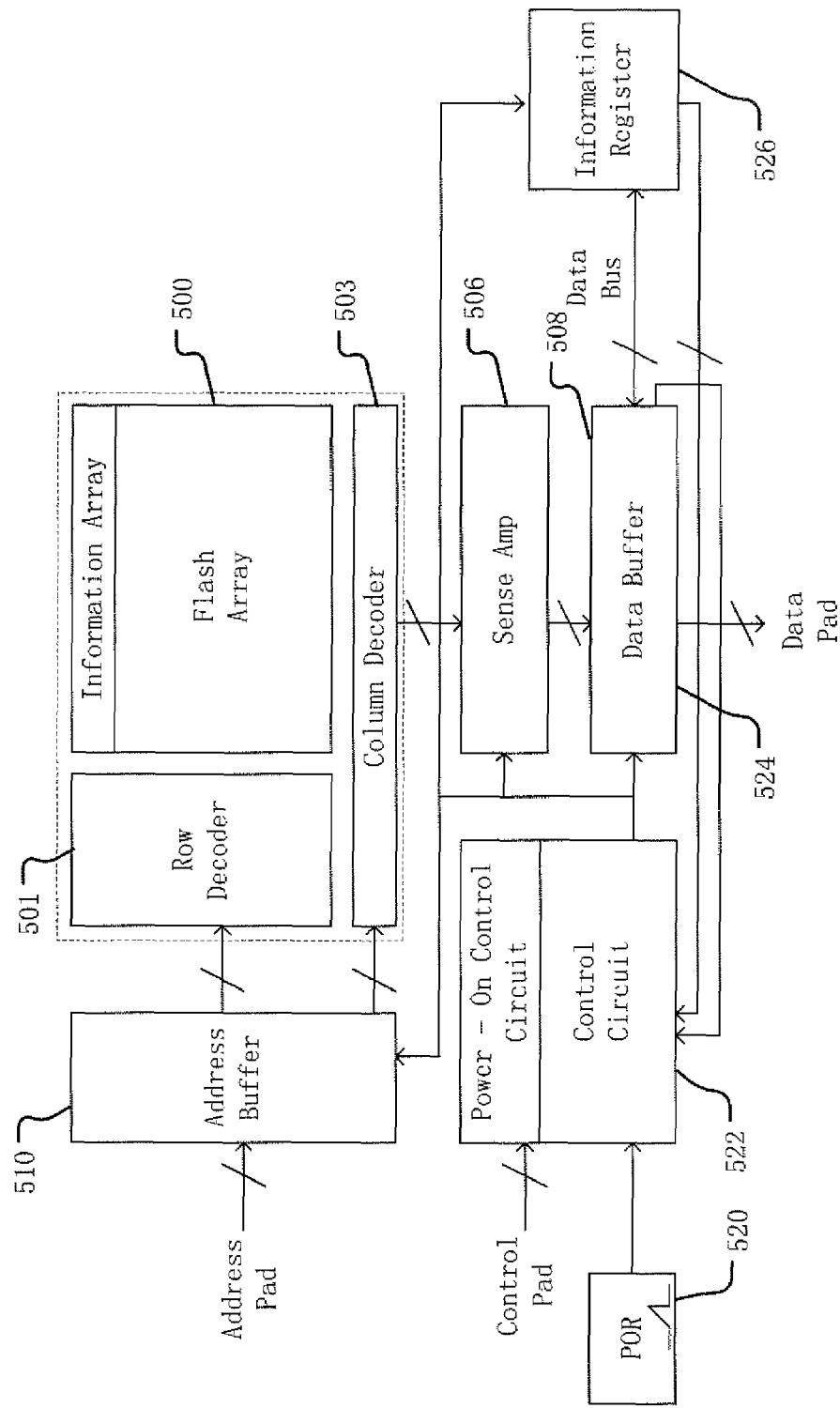
FIG. 5 is an exemplary block diagram of a chart of power voltage versus time, showing a window of operation for an embodiment.

FIG. 5 is an exemplary block diagram of a chart of an integrated circuit embodiment with a dynamic read reference.

The integrated circuit includes a nonvolatile memory array 500 which includes an information array storing control information that is read into registers on power up. A row decoder 501 is coupled to the nonvolatile memory array 500 via a plurality of word lines arranged along rows in the memory array 500. A column decoder 503 is coupled to the memory array 500 via a plurality of bit lines arranged along columns in the memory array 500. Addresses are supplied on a bus to the column decoder 503 and the row decoder 501 from the address buffer 510. The sense amplifier 506 and data buffer 508 are coupled to the column decoder 503 via data buses. Data from the information array is stored in the information registers 526, to control the control circuit 522, which also includes the power on control circuit. The power on reset circuit 520 is coupled to the control circuit 522. The control circuit dynamically adjusts the read reference used to determine the logical sate of data read from the flash array 500, as disclosed herein.

Figure 6A:
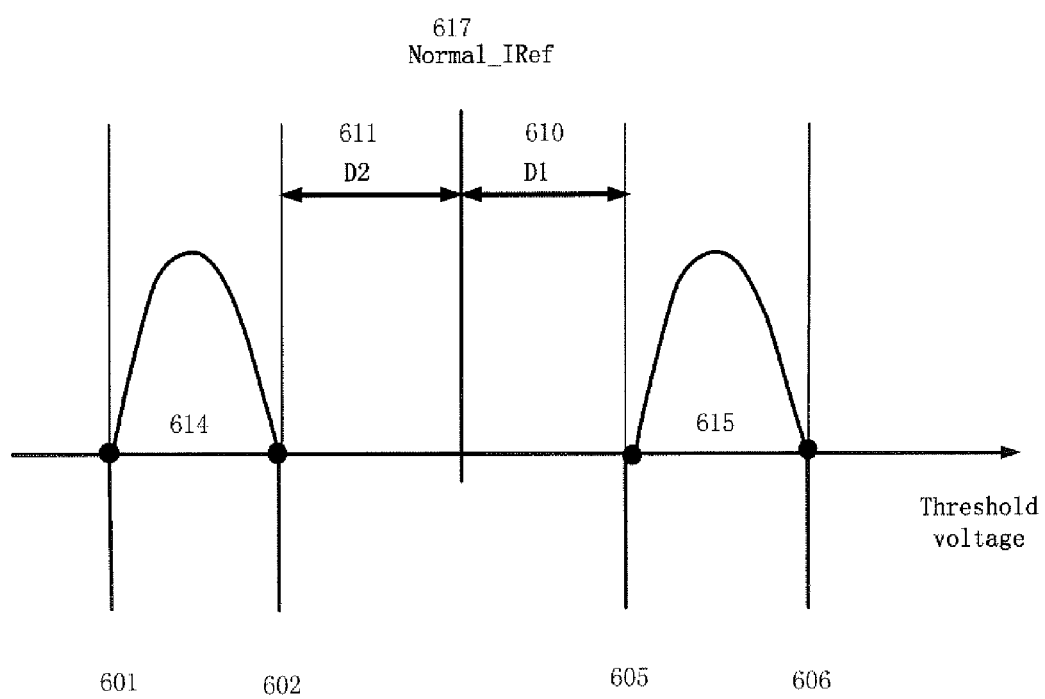
FIG. 6A is an exemplary threshold voltage algorithm also showing a representative read reference determining the logical value associated with stored threshold voltage value.

FIG. 6A is an exemplary threshold voltage algorithm also showing a representative read reference determining the logical value associated with stored threshold voltage value.

601 is the low bound of the low threshold voltage distribution 614. 602 is the high bound of the low threshold voltage distribution 614. 605 is the low bound of the high threshold voltage distribution 615. 606 is the high bound of the high threshold voltage distribution 615. A sense amplifier will sense the memory data by using a normal_Iref 607 and have a margin D1 610 for charge loss of high threshold voltage cells and margin D2 611 for charge gain of low threshold voltage cells. Although only two logical levels are shown, other embodiments have four or more logical levels to represent two or more bits. During power on sequence, the read margin is quite small so must be adjusted from the normal_Iref 607 shown here.

Figure 6B:
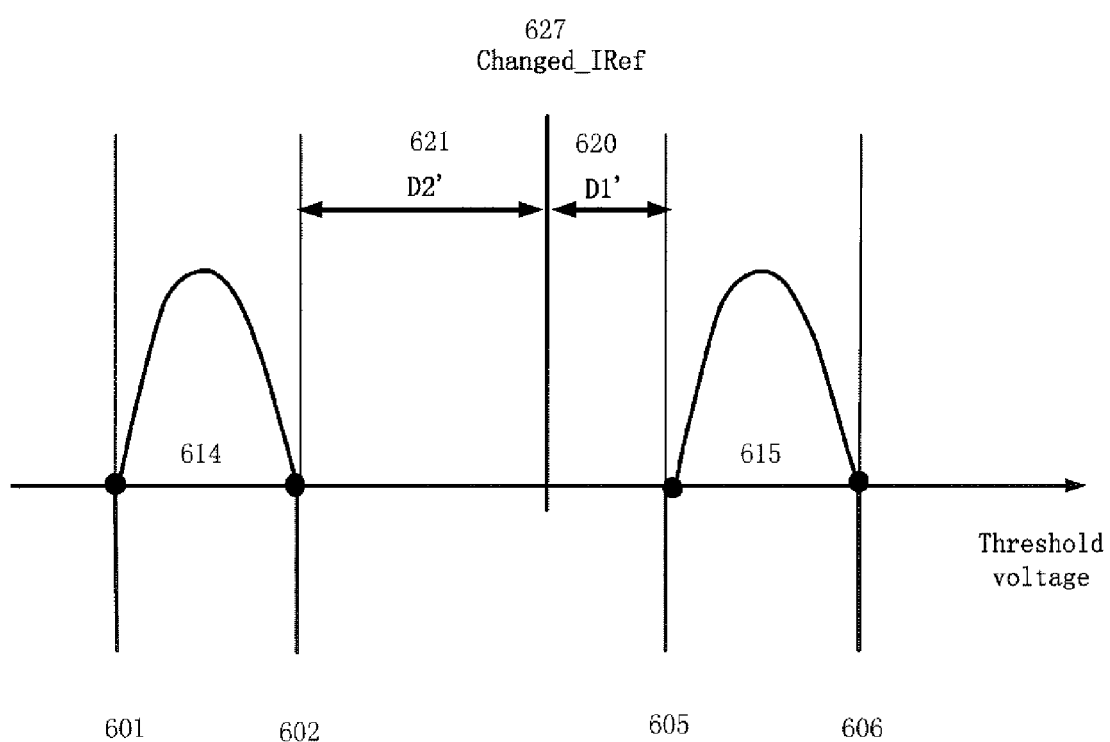
FIG. 6B is an exemplary threshold voltage algorithm showing an adjusted read reference determining the logical value associated with a stored threshold voltage value.

FIG. 6B is an exemplary threshold voltage algorithm showing an adjusted read reference determining the logical value associated with a stored threshold voltage value.

The read reference has been adjusted to Changed_Iref 627, because a prior comparison of data from the information array indicated too many bits having the logical value corresponding to the high threshold voltage distribution 615, relative to the logical value corresponding to the low threshold voltage distribution 614. Accordingly, future reads will tend to have an increased number of bits having the logical value corresponding to the low threshold voltage distribution 614, relative to the logical value corresponding to the high threshold voltage distribution 615.

Figure 6C:
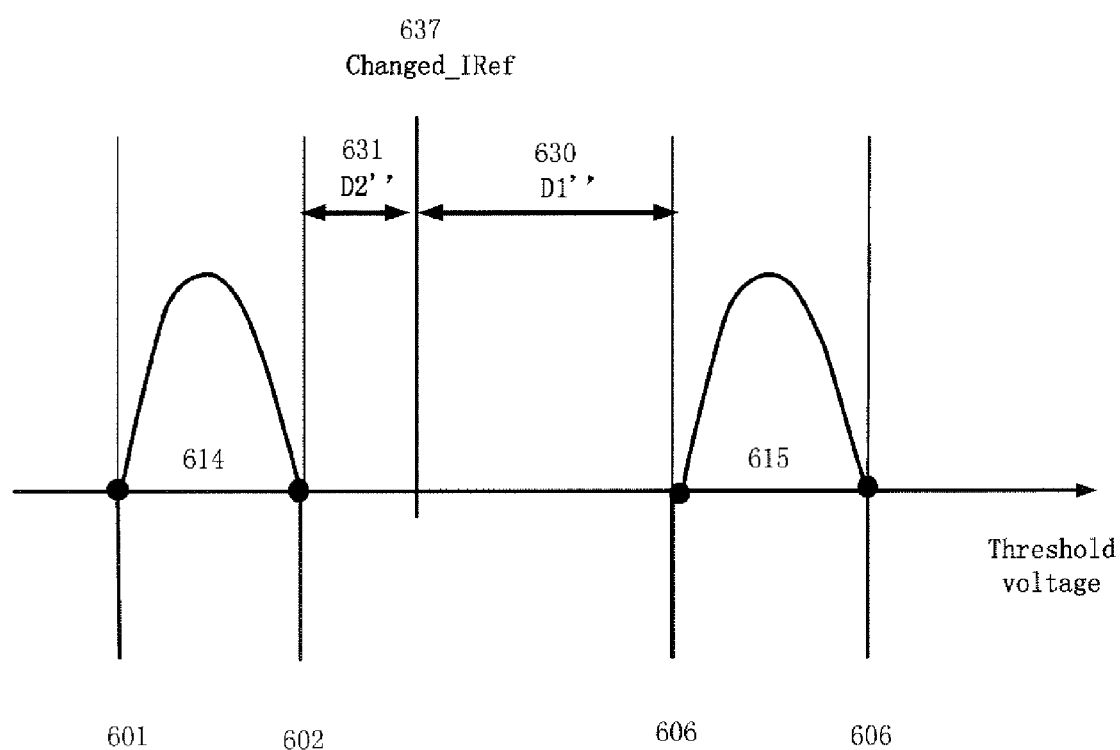
FIG. 6C is an exemplary threshold voltage algorithm also showing an adjusted read reference determining the logical value associated with a stored threshold voltage value.

FIG. 6C is an exemplary threshold voltage algorithm also showing an adjusted read reference determining the logical value associated with a stored threshold voltage value.

The read reference has been adjusted to Changed_Iref 637, because a prior comparison of data from the information array indicated too many bits having the logical value corresponding to the low threshold voltage distribution 614, relative to the logical value corresponding to the high threshold voltage distribution 615. Accordingly, future reads will tend to have an increased number of bits having the logical value corresponding to the high threshold voltage distribution 615, relative to the logical value corresponding to the low threshold voltage distribution 614.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating an integrated circuit under dynamic power conditions, comprising:

during a change of a power voltage, in response to at least one comparison of data having a first logical value and data having a second logical value read from a nonvolatile memory with a read reference level, adjusting the read reference level determining the first logical value and the second logical value from each other, wherein the first logical value and the second logical value are represented by different ranges of a physical characteristic stored by the nonvolatile memory.

2. The method of claim 1, further comprising:

during the change of the power voltage to the steady value, and after said adjusting the read reference level, reading bandgap data controlling the integrated circuit from the nonvolatile memory with the updated read reference level.

3. The method of claim 1, further comprising:

during the change of the power voltage to the steady value, and after said adjusting the read reference level, reading programming data controlling the integrated circuit from the nonvolatile memory with the read reference level.

4. The method of claim 1, further comprising:

during the change of the power voltage to the steady value, and after said adjusting the read reference level, reading erasing data controlling the integrated circuit from the nonvolatile memory with the read reference level.

5. The method of claim 1, further comprising:

during the change of the power voltage to the steady value, and after said adjusting the read reference level, reading program pulse width data controlling the integrated circuit from the nonvolatile memory with the read reference level.

6. The method of claim 1, further comprising:

during the change of the power voltage to the steady value, and after said adjusting the read reference level, reading program pulse voltage data controlling the integrated circuit from the nonvolatile memory with the read reference level.

7. The method of claim 1, further comprising:

during the change of the power voltage to the steady value, and after said adjusting the read reference level, reading erase pulse width data controlling the integrated circuit from the nonvolatile memory with the read reference level.

8. The method of claim 1, further comprising:

during the change of the power voltage to the steady value, and after said adjusting the read reference level, reading erase pulse voltage data controlling the integrated circuit from the nonvolatile memory with the read reference level.

9. The method of claim 1, wherein in response to said comparison of data showing an excess amount of data having the first logical value relative to data having the second logical value, adjusting the read reference level such that a comparison of data from additional reads from the nonvolatile memory during the change of the power voltage will have a more balanced amount of data having the first logical value relative to data having the second logical value.

10. The method of claim 1, wherein said adjusting the read reference level occurs after a power on reset circuit is finished.

11. The method of claim 1, wherein said adjusting the read reference level is complete after the power voltage is sufficiently large for regular operation of the integrated circuit.

12. The method of claim 1, wherein said adjusting the read reference level occurs after a power fluctuation lowers the power voltage to be insufficiently large for regular operation of the integrated circuit.

13. The method of claim 1, wherein said adjusting the read reference level is complete after the power voltage is stable.

14. An integrated circuit operating under dynamic power conditions, comprising:

a nonvolatile memory array storing data having a first logical value and data having a second logical value, wherein the first logical value and the second logical value are represented by different ranges of a physical characteristic stored by the nonvolatile memory;

control logic coupled to the array, the control logic adjusting a read reference level for data read from the nonvolatile memory array by determining the first logical value and the second logic value from each other, by performing:

during a change of a power voltage, in response to at least one comparison of data having the first logical value and data having the second logical value read from the nonvolatile memory with a read reference level, adjusting the read reference level.

15. The circuit of claim 1, wherein said control logic performs:

during the change of the power voltage to the steady value, and after said adjusting the read reference level, reading bandgap data controlling the integrated circuit from the nonvolatile memory with the updated read reference level.

16. The circuit of claim 14, wherein said control logic performs:

during the change of the power voltage to the steady value, and after said adjusting the read reference level, reading programming data controlling the integrated circuit from the nonvolatile memory with the read reference level.

17. The circuit of claim 14, wherein said control logic performs:

during the change of the power voltage to the steady value, and after said adjusting the read reference level, reading erasing data controlling the integrated circuit from the nonvolatile memory with the read reference level.

18. The circuit of claim 14, wherein said control logic performs:

during the change of the power voltage to the steady value, and after said adjusting the read reference level, reading program pulse width data controlling the integrated circuit from the nonvolatile memory with the read reference level.

19. The circuit of claim 14, wherein said control logic performs:

during the change of the power voltage to the steady value, and after said adjusting the read reference level, reading program pulse voltage data controlling the integrated circuit from the nonvolatile memory with the read reference level.

20. The circuit of claim 14, wherein said control logic performs:

during the change of the power voltage to the steady value, and after said adjusting the read reference level, reading erase pulse width data controlling the integrated circuit from the nonvolatile memory with the read reference level.

21. The circuit of claim 14, wherein said control logic performs:

during the change of the power voltage to the steady value, and after said adjusting the read reference level, reading erase pulse voltage data controlling the integrated circuit from the nonvolatile memory with the read reference level.

22. The circuit of claim 14, wherein said control logic performs:

in response to said comparison of data showing an excess amount of data having the first logical value relative to data having the second logical value, adjusting the read reference level such that a comparison of data from additional reads from the nonvolatile memory during the change of the power voltage will have a more balanced amount of data having the first logical value relative to data having the second logical value.

23. The circuit of claim 14, wherein said control logic performs said adjusting the read reference level after a power on reset procedure is finished.

24. The circuit of claim 14, wherein said adjusting the read reference level is complete after the power voltage is sufficiently large for regular operation of the integrated circuit.

25. The circuit of claim 14, wherein said adjusting the read reference level is complete after the power voltage is stable.

26. An integrated circuit operating under dynamic power conditions, comprising:

means of adjusting a read reference level determining a first logic value and a second logical value from each other, during a change of a power voltage, in response to at least one comparison of data having the first logical value and data having the second logical value read from a nonvolatile memory with the read reference level, wherein the first logical value and the second logical value are represented by different ranges of a physical characteristic stored by the nonvoltaiel memory.

* * * * *

UNITED STATES PATENT AND TRADEMARK OFFICE
CERTIFICATE OF CORRECTION

PATENT NO. : 7,394,698 B1
APPLICATION NO. : 11/617030
DATED : July 1, 2008
INVENTOR(S) : Chi-Ling Chu et al.

It is certified that error appears in the above-identified patent and that said Letters Patent is hereby corrected as shown below:

In claim 26, column 8, line 10, cancel "logic" and replace with -- logical --.

Signed and Sealed this

Twenty-eighth Day of October, 2008

JON W. DUDAS
*Director of the United States Patent and Trademark Office*